(12) United States Patent
Wong

(10) Patent No.: US 6,662,347 B2
(45) Date of Patent: Dec. 9, 2003

(54) ON-CHIP DIAGNOSTIC SYSTEM, INTEGRATED CIRCUIT AND METHOD

(75) Inventor: Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/160,300

(22) Filed: May 30, 2002

(65) Prior Publication Data

US 2003/0097645 A1 May 22, 2003

(30) Foreign Application Priority Data

Oct. 2, 2001 (GB) .............................................. 0123614

(51) Int. Cl.$^7$ .............................................. G06F 17/50
(52) U.S. Cl. .................................. 716/4; 716/1; 716/16
(58) Field of Search ........................ 716/1, 4–5, 16–17; 714/724, 725

(56) References Cited

U.S. PATENT DOCUMENTS

| | | | |
|---|---|---|---|
| 4,604,744 A | * 8/1986 | Littlebury et al. | 714/724 |
| 5,617,429 A | * 4/1997 | Goto | 714/736 |
| 5,717,909 A | * 2/1998 | Nemirovsky et al. | 712/227 |
| 5,787,007 A | * 7/1998 | Bauer | 716/16 |
| 6,430,727 B1 | * 8/2002 | Warren | 716/4 |
| 6,477,683 B1 | * 11/2002 | Killian et al. | 716/1 |

* cited by examiner

Primary Examiner—Matthew Smith
Assistant Examiner—Paul Dinh
(74) Attorney, Agent, or Firm—Randall J. Bluestone; Harrington & Smith, LLP

(57) ABSTRACT

An on-chip diagnostic system is used with an internal bus (10) of an integrated circuit. The bus has a number of byte-wide data lanes. A register (20) of the system is arranged to store a byte pattern. A series of comparators (30) receive byte signals from each of the byte lanes of the internal bus (10) and compare these with the byte pattern from the register (20). Outputs from the comparators are provided to a decoder (40) which provides, in the case of one of the byte lanes containing the same byte as the data pattern, an output signal (50) identifying that data lane, to a diagnostic port of the integrated circuit. In this way more information may be provided at the diagnostic port at any one time. An entire internal bus may be monitored in a single test run whilst at the same time making more of the diagnostic port available for tracing control signals, thus reducing the amount of time required to determine the cause of chip design problems.

32 Claims, 2 Drawing Sheets

10

ON-CHIP DIAGNOSTIC SYSTEM, INTEGRATED CIRCUIT AND METHOD

FIELD OF THE INVENTION

This invention relates to Integrated Circuits (ICs), and particularly but not exclusively to Application Specific Integrated Circuits (ASICs) and Field Programmable Gate Arrays (FPGAs) having on-chip diagnostic arrangements.

BACKGROUND OF THE INVENTION

In the field of this invention it is known for ASIC and FPGA designs to have an inbuilt diagnostic or debugging port which allows the monitoring of internal data buses, address buses and control signals. When a diagnostic test is being performed, the diagnostic port is typically coupled directly to an external logic analyser or oscilloscope and signals internal to the IC are multiplexed onto the port so that a trace can be obtained at the external device. During the bring-up and test phases of an IC's development, such traces are often invaluable in the analysis of a design problem as they can help to determine the internal state of the IC when that problem occurs.

However, this approach has the disadvantage that the number of signals that can be observed through a diagnostic port at any one time is limited. IC pin assignment priority is necessarily given to functional Input/Output signals and to power. The number of spare pins left over that can be assigned to a diagnostic port is therefore usually severely limited.

Traditional diagnostic methods were arranged to output an entire bus onto the diagnostic port for analysis. However, if the width of an internal bus exceeds that of the diagnostic port, then it is not possible to monitor the entire bus in a single test run. The internal bus must be divided into segments and several test runs must be performed with a different segment multiplexed onto the diagnostic port each time. For instance, to monitor a 128-bit internal data bus through a 32-bit diagnostic port, four separate runs are needed to trace the entire bus.

In addition to this, it is often useful if the trace of the bus is accompanied by a trace of the signals that control the bus. In order to make room for these control signals the size of the internal bus segment being monitored during a test run must be reduced. This results in an even greater number of test runs in order to obtain a complete trace of the internal bus and its control signals. All of the above considerations extend the time necessary for the bring-up phase of a new IC design.

A need therefore exists for an on-chip diagnostic system, integrated circuit and method wherein the abovementioned disadvantages may be alleviated.

STATEMENT OF INVENTION

In accordance with a first aspect of the present invention there is provided an on-chip diagnostic system for use with an internal bus of an integrated circuit, the bus having a number of data lanes, the system comprising: a register arranged to store a data pattern; a comparator arrangement coupled to receive data signals from each of the data lanes of the internal bus and further coupled to receive the data pattern from the register, for providing a compared output; and, a decoding arrangement coupled to receive the compared output, for providing a decoded integer output signal, wherein the decoded integer output signal identifies one of the number of data lanes in the case that the one of the number of data lanes contains data signals corresponding to the data pattern stored in the register.

In accordance with a second aspect of the present invention there is provided an integrated circuit comprising: an internal bus having a number of data lanes; a register arranged to store a data pattern; a comparator arrangement coupled to receive data signals from each of the data lanes of the internal bus and further coupled to receive the data pattern from the register, for providing a compared output; and, a decoding arrangement coupled to receive the compared output, for providing a decoded integer output signal, wherein the decoded integer output signal identifies one of the number of data lanes in the case that the one of the number of data lanes contains data signals corresponding to the data pattern stored in the register.

Preferably, there is provided an integrated circuit comprising at least two integrated circuits of the second aspect, wherein the at least two integrated circuits share a common register.

Preferably, there is provided the system or circuit of either aspect further comprising a diagnostic port coupled to receive the decoded integer output signal, and arranged to provide the decoded integer output signal to an external diagnostic device.

Preferably a diagnostic port is coupled to receive the decoded integer output signal, and arranged to provide the decoded integer output signal to an external diagnostic device. The comparator arrangement preferably has a number of comparators, the number of comparators being equal to the number of data lanes of the bus.

Preferably an output flag circuit is provided, which is arranged to provide an output flag in the case that the one of the number of data lanes contains data signals corresponding to the data pattern stored in the register. The output flag circuit is preferably an OR gate having a number of inputs coupled to receive the compared outputs from each of the number of comparators.

Each of the number of comparators preferably has an input width equal to the width of the data lanes. Preferably each data lane is a positive integer number of byte lanes, and the data pattern comprises the positive integer number of bytes. The integer number is preferably one, the data lane being a byte lane comprising 8 bits, and the data pattern being a byte pattern comprising 8 bits.

In this way the entire bus may be monitored in a single test run using the diagnostic port. In addition, a trace of bus control signals may be made at the same time. The number of test runs is therefore reduced and the time taken for the bring-up phase of a new IC design is considerably shortened.

BRIEF DESCRIPTION OF THE DRAWINGS

One on-chip diagnostic system, integrated circuit and method incorporating the present invention will now be described, by way of example only, with reference to the accompanying drawings, in which.

DESCRIPTION OF PREFERRED EMBODIMENTS

Figure 1:
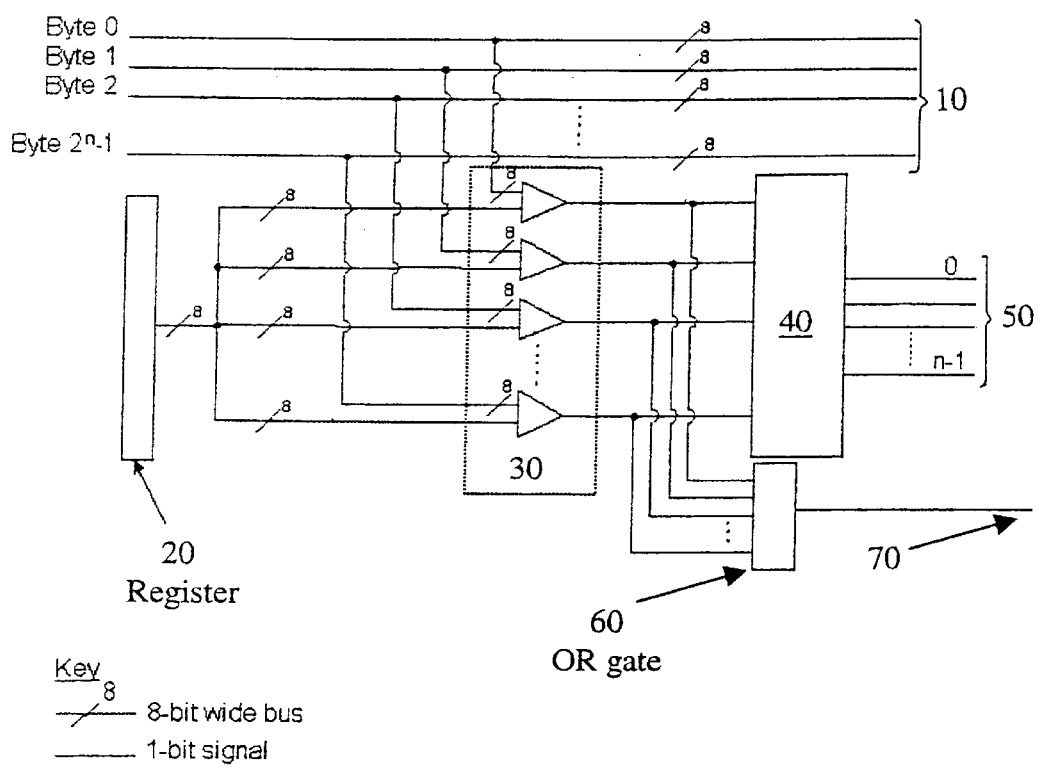
FIG. 1 shows an illustrative block diagram of an integrated circuit incorporating an on-chip diagnostic system in accordance with the present invention.

FIG. 1 shows a block diagram of an on-chip diagnostic system incorporated in an IC. It will be understood that several such diagnostic systems may be incorporated in a single IC. A (2^n)-byte wide internal bus 10 of the IC, which may be a data or an address bus, is to be monitored. The bus 10 has a number of byte lanes, this number typically being an integer power of two, such as 4 (2^2) or 16 (2^4). Each byte lane is arranged for transmitting 8 bits of data.

A series of 8-bit digital comparators 30, each have an output port, a first input port coupled to a different byte lane of the bus 10, and a second input port which is loaded from an 8-bit register 20, which is arranged to provide a predefined byte pattern to be further described below. It will be understood that the 8-bit register 20 will be built in to the IC as part of its design.

If the byte in a particular byte lane matches the byte pattern in the register, the output of the comparator coupled to that byte lane is high. An OR gate 60 is coupled to receive the outputs from the series of comparators 30, such that a "Byte Present" flag 70 is provided in the case that the byte pattern loaded from the register 20 matches that appearing on one of the byte lanes.

The output ports of the series of comparators are also coupled individually to inputs of a (2^n)-to-n decoder 40. If the pth input of the decoder (where 0<=p<2^n) is high then the decoder will output the binary number, p. p is therefore the number of the byte lane on which the byte pattern appeared. The decoder 40 will be arranged such that should the byte pattern appear on more than one byte lane, a priority scheme will ensure that a particular byte lane (e.g. the highest numbered byte lane in which the byte pattern appears) is decoded. The n-bit byte lane binary number together with the "Byte Present" flag can then be multiplexed onto the IC diagnostic port (not shown).

Figure 2:
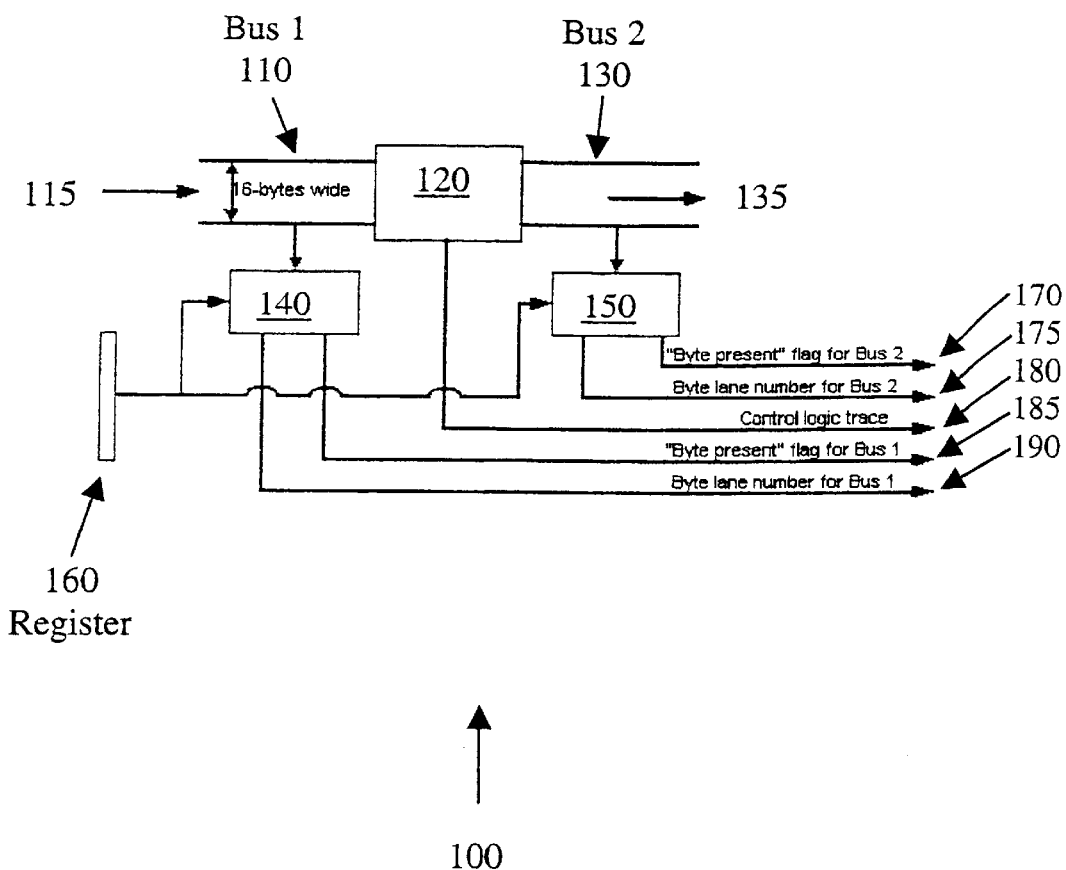
FIG. 2 shows an illustrative block diagram of an integrated circuit incorporating two on-chip diagnostic systems in accordance with the present invention.

FIG. 2 shows an example of how the above diagnostic system may be used. A data steering logic block 120 takes input data 115 from a contiguous address space on the first bus 110 and re-formats that data by adding an 8-byte header to the front and an 8-byte tail banner to the back (see example below). It then transmits this as output data 135 to a second bus 130. The first and the second bus 110 and 130 respectively are 16 bytes wide and both have diagnostic system incorporated, namely a first system 140 and a second system 150. The first and the second systems 140 and 150 respectively are similar to that described above with reference to FIG. 1, with the exception that they share a single register 160.

It will be appreciated that a diagnostic system must be built in to each bus which will require diagnostic analysis, and this must be decided during the design phase of a chip.

The first diagnostic system 140 provides a "Byte Present" bit flag 185 and a 4-bit byte lane number 190, which are provided externally via a 32-bit diagnostic port (not shown). Similarly the second diagnostic system 150 provides a "Byte Present" bit flag 170 and a 4-bit byte lane number 175, which are provided externally via the 32-bit diagnostic port. A partial trace of the data steering logic's control signals 180 is also provided to the 32-bit diagnostic port.

In operation and by way of example, the input data 115 comprising quadwords I(0), I(1) and I(2) are fed into the data steering logic 120 from the first bus 110 on consecutive clock cycles (N.B. 1 quadword=16 bytes). The data steering logic 120 should provide the data output 135 on the second bus 130 as four quadwords O(0), O(1), O(2) and O(3) on following clock cycles. The values of I(0), I(1), I(2) and the correct values of O(0), O(1), O(2) and O(3) are:

(N.B. all byte values are given in hex)

| Byte: | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| I(0): | 0F | 0E | 0D | 0C | 0B | 0A | 09 | 08 | 07 | 06 | 05 | 04 | 03 | 02 | 01 | 00 |
| I(1): | 1F | 1E | 1D | 1C | 1B | 1A | 19 | 18 | 17 | 16 | 15 | 14 | 13 | 12 | 11 | 10 |
| I(2): | 2F | 2E | 2D | 2C | 2B | 2A | 29 | 28 | 27 | 26 | 25 | 24 | 23 | 22 | 21 | 20 |
| O(0): | 07 | 06 | 05 | 04 | 03 | 02 | 01 | 00 | BE | EF | BE | EF | AA | AA | AA | AA |
| O(1): | 17 | 16 | 15 | 14 | 13 | 12 | 11 | 10 | 0F | 0E | 0D | 0C | 0B | 0A | 09 | 08 |
| O(2): | 27 | 26 | 25 | 24 | 23 | 22 | 21 | 20 | 1F | 1E | 1D | 1C | 1B | 1A | 19 | 18 |
| O(3): | CA | FE | CA | FE | 00 | 00 | 00 | 00 | 2F | 2E | 2D | 2C | 2B | 2A | 29 | 28 |

As can be seen, the steering logic should insert the header (BEEFBEEFAAAAAAAAh) on bytes 0–7 of quadword O(0). Bytes 0–7 of I(0) are then copied into bytes 8–15 of O(0). O(1) consists of the last 8 bytes of I(0) and the first 8 bytes of I(1). Similarly O(2) consists of the last 8 bytes of I(1) and the first 8 of I(2). Finally O(3) consists of the last 8 bytes of I(2) and the tail banner (CAFECAFE00000000h).

During a test run, a mis-compare is encountered. The output quadwords are actually:

| Byte: | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| O(0): | 07 | 06 | 05 | 04 | 03 | 02 | 01 | 00 | BE | EF | BE | EF | AA | AA | AA | AA |
| O(1): | 16 | 15 | 14 | 13 | 12 | 11 | 10 | 0F | 0E | 0D | 0C | 0B | 0A | 09 | 08 | 07 |
| O(2): | 26 | 25 | 24 | 23 | 22 | 21 | 20 | 1F | 1E | 1D | 1C | 1B | 1A | 19 | 18 | 17 |
| O(3): | CA | FE | CA | FE | 00 | 00 | 00 | 00 | 2E | 2D | 2C | 2B | 2A | 29 | 28 | 27 |

The second, third and fourth output quadwords are incorrect. It would appear that this error occurs when the data steering logic 120 outputs the second quadword. Knowledge of the control signal values at this point will be invaluable.

Note that in this example the data has not been corrupted (no parity errors have occurred) but merely shifted incorrectly. A trace of the control logic signals at the time of failure can be obtained by the following method:

1. Choose a diagnostic byte pattern e.g. ABh (AB-hexadecimal), and load this into register 160.
2. Place the ABh pattern at strategic points in the input data and then re-define the remainder of the input data so that no other bytes contain the diagnostic byte pattern. Likewise, ensure that the 8-byte header and tail do not contain this byte pattern. In this example, the pattern ABh is placed in such a way that it will appear on the second, third and fourth output quadwords:

| Byte: | 15 | 14 | 13 | 12 | 11 | 10 | 9  | 8  | 7  | 6  | 5  | 4  | 3  | 2  | 1  | 0  |
|-------|----|----|----|----|----|----|----|----|----|----|----|----|----|----|----|----|
| I(0): | 0F | 0E | 0D | 0C | 0B | 0A | 09 | AB | 07 | 06 | 05 | 04 | 03 | 02 | 01 | 00 |
| I(1): | 1F | 1E | 1D | 1C | 1B | 1A | 19 | AB | 17 | 16 | 15 | 14 | 13 | 12 | 11 | 10 |
| I(2): | 2F | 2E | 2D | 2C | 2B | 2A | 29 | AB | 27 | 26 | 25 | 24 | 23 | 22 | 21 | 20 |

Note: the pattern to trace, ABh, has been placed in byte 8 of I(0), I(1) and I(2).

3. Re-run the test with modified input data which, due to the shifting error, will produce the following output:

| Byte: | 15 | 14 | 13 | 12 | 11 | 10 | 9  | 8  | 7  | 6  | 5  | 4  | 3  | 2  | 1  | 0  |
|-------|----|----|----|----|----|----|----|----|----|----|----|----|----|----|----|----|
| O0:   | 07 | 06 | 05 | 04 | 03 | 02 | 01 | 00 | BE | EF | BE | EF | AA | AA | AA | AA |
| O1:   | 16 | 15 | 14 | 13 | 12 | 11 | 10 | 0F | 0E | 0D | 0C | 0B | 0A | 09 | AB | 07 |
| O2:   | 26 | 25 | 24 | 23 | 22 | 21 | 20 | 1F | 1E | 1D | 1C | 1B | 1A | 19 | AB | 17 |
| O3:   | CA | FE | CA | FE | 00 | 00 | 00 | 00 | 2E | 2D | 2C | 2B | 2A | 29 | AB | 27 |

The trace that appears on the 32-bit diagnostic port will indicate that the ABh byte pattern appeared as input data 115 on the first bus 110 three times and on each occasion on byte lane 8. It will also indicate that the pattern appeared three times on the output data 135 of the second bus 130 and in each instance this was on byte lane 1. It is at these times that the shifting error occurred as the ABh pattern was expected on byte lane 0. Since a partial trace 180 of the control signals of the data steering logic 120 are also output on the 32-bit diagnostic port, the state of the control logic can be ascertained at the time of failure.

From this example it can be seen that a trace of control signals at the time of failure can be obtained with just a single test run. Without the use of the invention, and given the relative sizes of the first and second data busses 110 and 130 respectively and size of the 32-bit diagnostic port, it would have required several runs to get a trace showing that the data steering logic 120 had placed data on the wrong byte lanes. In addition, with the 32-bit diagnostic port monitoring only the data bus, there would have been no room left on the port to trace the control signals 180.

The example above contains a very small amount of data. In typical test runs, hundreds of quadwords of data may flow through the piece of logic under test before a mis-compare is detected. By strategically placing a unique byte pattern in the test data (preferably in and around the time of failure) and using the invention, the state of control signals can be ascertained.

It should be noted that the invention is used to help diagnose a problem that may have been detected through prior testing or through field use.

It will be understood that the present invention as described above provides the following advantages:

It allows more information to be presented via a diagnostic port at any one time. It allows an entire internal bus to be monitored in a single test run whilst at the same time making more of the diagnostic port available for tracing control signals.

It can reduce the amount of time required to determine the cause of an IC design problem.

It will be appreciated that alternative embodiments to the one described above are possible. For example, the number and arrangement of byte lanes, and the number of outputs from the decoder 40 may differ from that described above. For example, if the bus 10 was not just ($2^n$)-bytes wide but ($x*(2^n)$)-bytes wide (where x is a positive integer, x>1), the register 20 could be expanded to become an x-byte wide register. The comparator series 30 could then be implemented using x-byte comparators. An x byte wide pattern could then be detected. By widening the pattern more unique pattern combinations can be detected.

Similarly, if for a given implementation, the number of byte lanes does not equal $2^n$ but some another number, for example, a width of w bytes, where (($2^p$)<w<($2^q$)), and where p and q are non-negative integers), then the ($2^n$) comparators 30 would be replaced by w comparators and decoder 40 would be replaced by a ($2^q$)-to-q decoder. The output of the comparators would be connected to the first w inputs of the decoder. The remaining inputs would then be tied low.

What is claimed is:

1. An on-chip diagnostic system for use with an internal bus of an integrated circuit, said bus having a number of data lanes, said system comprising:
    a register arranged to store a data pattern;
    a comparator arrangement coupled to receive data signals from each of said data lanes of said internal bus and further coupled to receive said data pattern from said register, for providing a compared output; and,
    a decoding arrangement coupled to receive said compared output, for providing a decoded integer output signal,
    wherein said decoded integer output signal identifies one of said number of data lanes in the case that said one of said number of data lanes contains data signals corresponding to said data pattern stored in said register.

2. The system of claim 1 further comprising a diagnostic port coupled to receive said decoded integer output signal, and arranged to provide said decoded integer output signal to an external diagnostic device.

3. The system of claim 2 wherein said comparator arrangement has a number of comparators, said number of comparators being equal to said number of data lanes of the bus.

4. The system of claim 3 further comprising an output flag circuit arranged to provide an output flag in the case that said one of the number of data lanes contains data signals corresponding to said data pattern stored in said register.

5. The system of claim 4 wherein said output flag circuit is an OR gate having a number of inputs coupled to receive said compared outputs from each of said number of comparators.

6. The system of claim 5 wherein each of said number of comparators has an input width equal to the width of said data lanes.

7. The system of claim 6 wherein each data lane is a positive integer number of byte lanes, and said data pattern comprises said positive integer number of bytes.

8. The system of claim 7 wherein said integer number is one, said data lane being a byte lane comprising 8 bits, and said data pattern being a byte pattern comprising 8 bits.

9. An integrated circuit comprising:
an internal bus having a number of data lanes;
a register arranged to store a data pattern; a comparator arrangement coupled to receive data signals from each of said data lanes of said internal bus and further coupled to receive said data pattern from said register, for providing a compared output; and,
a decoding arrangement coupled to receive said compared output, for providing a decoded integer output signal, wherein said decoded integer output signal identifies one of said number of data lanes in the case that said one of said number of data lanes contains data signals corresponding to said data pattern stored in said register.

10. The circuit of claim 9 further comprising a diagnostic port coupled to receive said decoded integer output signal, and arranged to provide said decoded integer output signal to an external diagnostic device.

11. The circuit of claim 10 wherein said comparator arrangement has a number of comparators, said number of comparators being equal to said number of data lanes of the bus.

12. The circuit of claim 11 further comprising an output flag circuit arranged to provide an output flag in the case that said one of the number of data lanes contains data signals corresponding to said data pattern stored in said register.

13. The circuit of claim 12 wherein said output flag circuit is an OR gate having a number of inputs coupled to receive said compared outputs from each of said number of comparators.

14. The circuit of claim 13 wherein each of said number of comparators has an input width equal to the width of said data lanes.

15. The circuit of claim 14 wherein each data lane is a positive integer number of byte lanes, and said data pattern comprises said positive integer number of bytes.

16. The circuit of claim 15 wherein said integer number is one, said data lane being a byte lane comprising 8 bits, and said data pattern being a byte pattern comprising 8 bits.

17. An integrated circuit comprising at least two integrated circuits as claimed in claim 16, wherein said at least two integrated circuits share a common register.

18. An on-chip diagnostic method for use with an internal bus of an integrated circuit, said bus having a number of data lanes, said method comprising the steps of:
storing a data pattern in an internal register; comparing data signals from each of said data lanes of said internal bus with said data pattern stored in said register, and, providing a decoded integer output signal which identifies one of said number of data lanes in the case that said one of said number of data lanes contains data signals corresponding to said data pattern stored in said register.

19. The method of claim 18 wherein each data lane is a positive integer number of byte lanes, and said data pattern comprises said positive integer number of bytes.

20. The method of claim 19 wherein said integer number is one, said data lane being a byte lane comprising 8 bits, and said data pattern being a byte pattern comprising 8 bits.

21. A method for use with an internal bus of an integrated circuit, said bus having a plurality of data lanes, comprising:
storing a data pattern in said integrated circuit;
comparing data signals appearing on said plurality of data lanes to said stored data pattern;
generating at an output of said integrated circuit a first output signal that identifies one of said plurality of data lanes wherein said data signals match said stored data pattern; and
further generating at an output of said integrated circuit a second output signal that indicates a state of at least some integrated circuit control signals.

22. The method of claim 21, where each data lane comprises a positive integer number of byte lanes, and where said stored data pattern comprises said positive integer number of bytes.

23. The method of claim 22, where said integer number equals one, said data lane comprises a byte lane, and said data pattern comprises a byte data pattern.

24. The method of claim 21, where said first output signal comprises a flag for signalling an occurrence of a match condition that data signals appearing on one of said plurality of data lanes match said stored data pattern, and further comprises an identification of which one of said plurality of data lanes resulted in the occurrence of said match condition.

25. The method of claim 21, where said output of said integrated circuit comprises a part of a diagnostic port, and where said first and second output signals are multiplexed to said diagnostic port.

26. The method of claim 21, where if more than one of said plurality of data lanes simultaneously have data signals that match said stored data pattern, said first output signal identifies a highest priority one of said matching data lanes based on a priority scheme.

27. Diagnostic circuitry coupled to an internal bus of an integrated circuit, said bus having a plurality of data lanes, comprising:
means for storing a data pattern;
means having inputs coupled to said plurality of bus lanes and to an output of said storing
means for comparing data signals appearing on said plurality of data lanes to said stored data pattern; and
means having inputs coupled to outputs of said comparing means for generating at an output of said integrated circuit a first output signal that identifies one of said plurality of data lanes wherein said data signals match said stored data pattern and a second output signal that indicates a state of at least some integrated circuit control signals.

28. Circuitry as in claim 27, where each data lane comprises a positive integer number of byte lanes, and where said stored data pattern comprises said positive integer number of bytes.

29. Circuitry as in claim 28, where said integer number equals one, said data lane comprises a byte lane, and said data pattern comprises a byte data pattern.

30. Circuitry as in claim 27, where said generating means outputs a flag for signalling an occurrence of a match condition that data signals appearing on one of said plurality of data lanes match said stored data pattern, and further outputs an identification of which one of said plurality of data lanes resulted in the occurrence of said match condition.

31. Circuitry as in claim 27, where said output of said integrated circuit comprises a part of a diagnostic port, and where said first and second output signals are multiplexed to said diagnostic port.

32. Circuitry as in claim 27, where if more than one of said plurality of data lanes simultaneously have data signals that match said stored data pattern, said generating means identifies a highest priority one of said matching data lanes based on a priority scheme.

* * * * *